(12) United States Patent
Iwasaki et al.

(10) Patent No.: US 12,484,374 B2
(45) Date of Patent: Nov. 25, 2025

(54) LIGHT-EMITTING ELEMENT AND LIGHT-EMITTING DEVICE

(71) Applicant: SHARP KABUSHIKI KAISHA, Sakai (JP)

(72) Inventors: Masataka Iwasaki, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 408 days.

(21) Appl. No.: 18/016,607

(22) PCT Filed: Aug. 4, 2020

(86) PCT No.: PCT/JP2020/029727
§ 371 (c)(1),
(2) Date: Jan. 17, 2023

(87) PCT Pub. No.: WO2022/029856
PCT Pub. Date: Feb. 10, 2022

(65) Prior Publication Data
US 2023/0292540 A1 Sep. 14, 2023

(51) Int. Cl.
*H10K 50/15* (2023.01)
*H10K 50/16* (2023.01)
*H10K 50/17* (2023.01)
*H10K 102/00* (2023.01)

(52) U.S. Cl.
CPC ......... *H10K 50/166* (2023.02); *H10K 50/156* (2023.02); *H10K 50/157* (2023.02); *H10K 50/171* (2023.02); *H10K 2102/331* (2023.02)

(58) Field of Classification Search
CPC .. H10K 50/166; H10K 50/157; H10K 50/171; H10K 50/156; H10K 2102/331
See application file for complete search history.

(56) References Cited

U.S. PATENT DOCUMENTS

| | | | |
|---|---|---|---|
| 2019/0081262 A1* | 3/2019 | Kim | C08K 3/36 |
| 2019/0157596 A1* | 5/2019 | Kim | H10K 50/115 |
| 2019/0198796 A1 | 6/2019 | Kim et al. | |
| 2019/0280235 A1 | 9/2019 | Kim et al. | |
| 2021/0119164 A1 | 4/2021 | Kim et al. | |

FOREIGN PATENT DOCUMENTS

| | | |
|---|---|---|
| JP | 2005290998 A | 10/2005 |
| JP | 2019160796 A | 9/2019 |

* cited by examiner

*Primary Examiner* — Peniel M Gumedzoe
(74) *Attorney, Agent, or Firm* — ScienBiziP, P.C.

(57) ABSTRACT

A light-emitting element includes the following: a cathode; an anode; a light-emitting layer provided between the cathode and the anode; an electron transport layer provided between the cathode and the light-emitting layer; and a potential well provided between the cathode and the light-emitting layer, and being a region having a larger electron affinity than a surrounding region.

16 Claims, 5 Drawing Sheets

LIGHT-EMITTING ELEMENT AND LIGHT-EMITTING DEVICE

TECHNICAL FIELD

The present disclosure relates to a light-emitting element and a light-emitting device.

BACKGROUND ART

Patent Literature 1 discloses a light-emitting element configured such that a pair of electrodes sandwiches and supports a plurality of layers. A configuration proposed in the light-emitting element disclosed in Patent Literature 1 is using a composite material of a hole injection material, which is an inorganic conductive compound such as molybdenum oxide, and a hole transport material, which is an organic compound. This configuration enables the light-emitting element to improve hole transport capability to its light-emitting layer.

CITATION LIST

Patent Literature

Patent Literature: Japanese Unexamined Patent Application Publication No. 2005-290998

SUMMARY

Technical Problem

The foregoing light-emitting element disclosed in Patent Literature 1 can improve the hole transport capability to the light-emitting layer. However, the light-emitting element disclosed in Patent Literature 1 is not configured to be able to prevent electrons that are injected into the light-emitting layer in accordance with the condition of hole injection. The carrier balance within the light-emitting layer is hence tipped toward an excess of electrons, thus unfortunately failing to improve external quantum efficiency (EQE) sufficiently.

The present disclosure aims to provide a light-emitting element and a light-emitting device that can improve the carrier balance within their light-emitting layers.

Solution to Problem

A light-emitting element according to one aspect of the present disclosure includes the following: a cathode; an anode; a light-emitting layer provided between the cathode and the anode; an electron transport layer provided between the cathode and the light-emitting layer; and a potential well provided between the cathode and the light-emitting layer, and being a region having a larger electron affinity than a surrounding region.

A light-emitting device according to one aspect of the present disclosure includes the following: a thin-film transistor, and a light-emitting element electrically connected to the thin-film transistor and including a cathode, an anode, a light-emitting layer provided between the cathode and the anode, an electron transport layer provided between the cathode and the light-emitting layer, and a potential well provided between the cathode and the light-emitting layer, and being a region having a larger electron affinity than a surrounding region.

DESCRIPTION OF EMBODIMENTS

The following describes the embodiments of the present disclosure with reference to the drawings. It is noted that throughout the drawings, like components will be denoted by the same signs, and their description will be omitted.

First Embodiment

Figure 1:
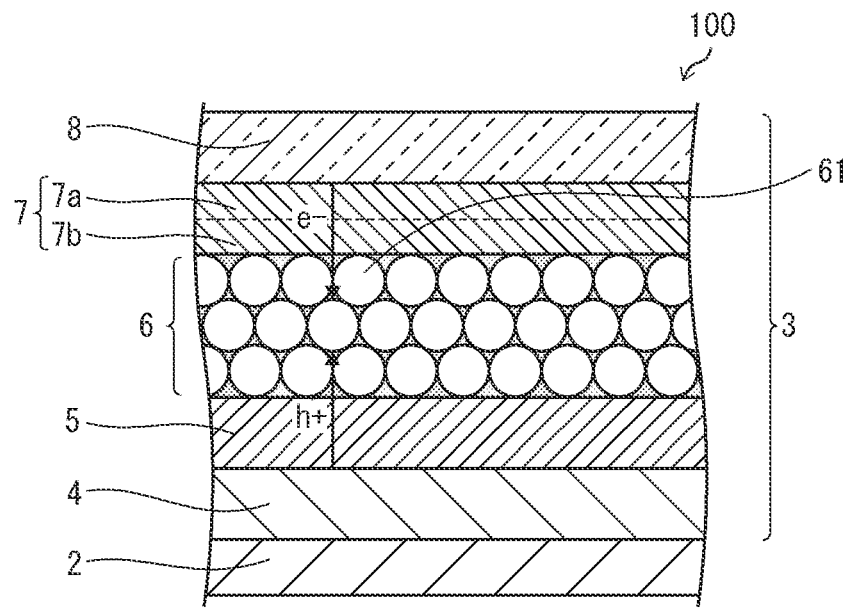
FIG. 1 is a schematic sectional view of a light-emitting device according to a first embodiment of the present disclosure.

FIG. 1 is a schematic sectional view of a light-emitting device 100 according to a first embodiment of the present disclosure. In FIG. 1, a direction from an array substrate 2 of the light-emitting device 100 toward a light-emitting element 3 of the same is described as "top" in some cases, and the opposite direction is described as "bottom" in some cases.

The light-emitting device 100 is a device that can be used for, for instance, a display of a TV set, smartphone or other things. The light-emitting device 100 has the array substrate 2 and the light-emitting element 3, as illustrated in FIG. 1. The array substrate 2 is a glass substrate with a thin-film transistor (TFT, not shown) for driving the light-emitting element 3 formed thereon. The light-emitting device 100 is designed such that the individual layers of the light-emitting element 3 are stacked on the array substrate 2, and such that the TFT on the array substrate 2 and the light-emitting element 3 are electrically connected together.

The light-emitting element 3 includes an anode 4, a hole transport layer 5, a light-emitting layer 6, an electron transport layer 7, and a cathode 8. The light-emitting element 3 can be composed by stacking the anode 4, the hole transport layer 5, the light-emitting layer 6, the electron transport layer 7 and the cathode 8 onto the array substrate 2 sequentially from the bottom.

Anode

The anode 4 is formed on the array substrate 2 and is electrically connected to the TFTs provided on the array substrate 2. The anode 4 can be composed by, for instance, stacking a metal that serves as a reflective layer and contains a material, such as Al, Cu, Au or Ag, all of which have high reflectivity of light, and stacking a transparent conductive film that serves as a transparent electrode, such as ITO, IZO, ZnO, AZO or BZO, all of which have light transparency. The anode 4 is formed onto the array substrate 2 through, for instance, the following process steps using sputtering, evaporation or other methods.

The first process step is stacking, through sputtering, a reflective layer onto the array substrate 2, followed by a transparent electrode via an insulating layer of polyimide or other materials. The next is forming contact holes in the reflective layer and insulating layer in order to route wires that electrically connect the transparent electrode and TFTs together. These contact holes can be formed by, for instance, patterning through photolithography. It is noted that the anode 4 is formed to have a thickness of 100 nm or smaller.

Hole Transport Layer

The hole transport layer 5 transports holes injected from the anode 4 to the light-emitting layer 6. The hole transport layer 5 is formed on the anode 4 and is electrically connected to the anode 4. The hole transport layer 5 can be made of, for instance, a material containing a metal oxide.

The metal oxide contained in the hole transport layer 5 can be, for instance, at least any one of molybdenum oxide ($MoO_3$), vanadium oxide ($V_2O_5$), tungsten oxide ($WO_3$) and rhenium oxide ($ReO_3$). The hole transport layer 5 can be also made of a metal oxide, such as NiO. The hole transport layer 5 can be made of, other than the foregoing inorganic materials, an organic material, such as a conductive polymer, or of a mixture of organic and inorganic materials.

However, the hole transport layer 5 is preferably made of an inorganic material in view of the reliability of the light-emitting element 3. Further, the inorganic material is preferably at least any one of $MoO_3$, $WO_3$, $V_2O_5$ and $ReO_3$ in view of efficient hole injection into the light-emitting layer 6. It is noted that the reliability of the light-emitting element 3 herein refers to whether the light-emitting element 3 can emit light at a constant luminance for a long time. The reliability of the light-emitting element 3 can be evaluated as, for instance, time series variations in the luminance of light emitted by the light-emitting element 3. Reasons why the inorganic material contained in the hole transport layer 5 is preferably at least any one of $MoO_3$, $WO_3$, $V_2O_5$ and $ReO_3$ will be described later on. It is noted that the thickness of the hole transport layer 5 falls within 1 to 50 nm inclusive for instance.

Light-Emitting Layer

The light-emitting layer 6 is provided between the anode 4 and the cathode 8, more specifically, between the hole transport layer 5 and the electron transport layer 7. The light-emitting layer 6 contains quantum dots 61 (semiconductor nanoparticles) and is composed of a stack of one or more layers of the quantum dots 61. The light-emitting layer 6 can be formed through, but not limited to, spin coating or ink-jet printing by the use of a dispersion liquid with the quantum dots 61 dispersed in a solvent of, but not limited to, hexane or toluene. The dispersion liquid may contain a dispersing material, such as a thiol or an amine. The light-emitting layer 6 preferably has a thickness (film thickness) of 5 to 50 nm inclusive so that a uniform film can be formed, and that efficient light emission can be achieved.

The quantum dots 61 are light-emitting materials that emit light in response to recombination of holes at a valence band level and electrons at a conduction band level. Light emitted from the quantum dots 61 has a narrow spectrum due to a quantum confinement effect, and hence, light emission of relatively deep chromaticity can be achieved.

The quantum dots 61 are semiconductor nanoparticles each having a core-shell structure including a CdSe core and a ZnS shell for instance. Other than the foregoing, the quantum dots 61 may be semiconductor nanoparticles each having a core-shell structure of CdSe—CdS, InP—ZnS, ZnSe—ZnS, CIGS-ZnS or other combinations. Further, ligands composed of an inorganic substance or an organic substance coordinate with the shell's perimeter in order to deactivate a defect on the shell's surface and in order for dispersibility into an applied solvent.

The quantum dots 61 have a particle diameter of about 3 to 15 nm. The wavelength of light emitted from the quantum dots 61 can be controlled by the particle diameter of the quantum dots 61. Hence, controlling the particle diameter of the quantum dots 61 can control the wavelength of light emitted by the light-emitting device 100.

Electron Transport Layer

The electron transport layer 7 is provided on the light-emitting layer 6 and transports electrons injected from the cathode 8 to the light-emitting layer 6. The electron transport layer 7 may contain at least one of, for instance, ZnO, ZnMgO, $TiO_2$, $Ta_2O_3$ and $SrTiO_3$ that can be processed into nanoparticles. The electron transport layer 7 contains ZnO or ZnMgO particularly.

However, if electrons are excessively transported to the light-emitting layer 6 through the electron transport layer 7, the anode 4 and the hole transport layer 5 deteriorate due to the excessively transported electrons, thus degrading the reliability of the light-emitting element 3. Accordingly, the configuration and material of the electron transport layer 7 need to be devised so that the electron transport layer 7 does not transport electrons excessively to the light-emitting layer 6. The configuration and material of the electron transport layer 7 that can reduce electron transport will be detailed later on.

Cathode

The cathode 8 is provided on the electron transport layer 7 and is electrically connected to the electron transport layer 7. The cathode 8 can be made of, for instance, metal processed into a thin film to such a degree as to have light transparency, or of a transparent material. An example of the metal constituting the cathode 8 is metals, including Al, Ag, and Mg. Further, examples of the transparent material constituting the cathode 8 include ITO, IZO, ZnO, AZO, and BZO. The cathode 8 can be formed through sputtering or evaporation for instance.

In the light-emitting device 100 having the foregoing configuration, holes (arrow $h^+$ in FIG. 1) injected from the anode 4 are transported through the hole transport layer 5 to the light-emitting layer 6. Further, electrons (arrow e in FIG. 1) injected from the cathode 8 are transported through the electron transport layer 7 to the light-emitting layer 6. The holes and electrons transported to the light-emitting layer 6 then recombine together within the quantum dots 61, thus generating excitons. The excitons then go back from an excited state to a ground state, thus allowing the quantum dots 61 to emit light.

It is noted that FIG. 1 illustrates that the light-emitting device 100 falls under a top-emission type, where light emitted from the light-emitting layer 6 is taken out via a side opposite to the array substrate 2 (FIG. 1, from above). However, the light-emitting device 100 may fall under a bottom-emission type, where light is taken out via the array substrate 2 (In FIG. 1, from below). When the light-emitting device 100 falls under the bottom-emission type, the cathode 8 is a reflective electrode, and the anode 4 is a transparent electrode.

Further, the light-emitting device 100 according to the first embodiment is configured such that the anode 4, the hole transport layer 5, the light-emitting layer 6, the electron transport layer 7, and the cathode 8 are stacked on the array substrate 2 sequentially from the bottom. However, the light-emitting device 100 may have an inverted configuration where the cathode 8, the electron transport layer 7, the light-emitting layer 6, the hole transport layer 5, and the anode 4 are stacked on the array substrate 2 sequentially from the bottom.

Material Constituting Hole Transport Layer

The following describes why the hole transport layer 5 is preferably made of an inorganic material in view of the reliability of the light-emitting element 3.

An evaluation experiment was conducted on the reliability of a light-emitting element by using a hole transport layer containing an organic material (hereinafter, referred to as an organic HTL), a hole transport layer containing an inorganic material (hereinafter, referred to as an inorganic HTL), and a hole transport layer containing an inorganic-and-organic combined material (hereinafter, referred to as an inorganic-organic HTL).

Firstly, a light-emitting element (organic HTL light-emitting element) that includes an organic HTL as its hole transport layer, a light-emitting element (inorganic HTL light-emitting element) that includes an inorganic HTL as its hole transport layer, and a light-emitting element (inorganic-organic HTL light-emitting element) that includes an inorganic-organic HTL as its hole transport layer were prepared; here, their anodes, cathodes, and electron transport layers were respectively made of ITO, Al, and ZnO.

Figure 2:
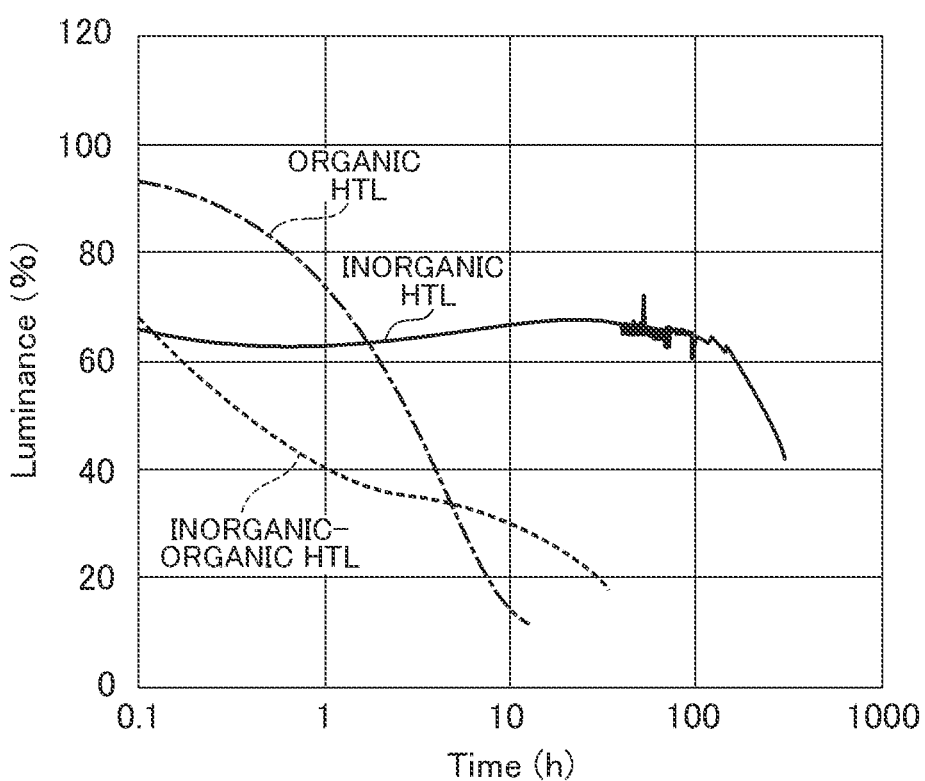
FIG. 2 is a graph showing how much effective a hole transport layer containing an inorganic material is in a light-emitting element according to the first embodiment of the present disclosure.

Then, time series variations in the light emission state of these light-emitting elements were examined to obtain a graph shown in FIG. 2. FIG. 2 is a graph showing how much effective a hole transport layer containing an inorganic material is in the light-emitting element 3 according to the first embodiment of the present disclosure. FIG. 2 shows time series variations in the luminance of light emitted by each of the light-emitting element that includes the organic HTL, the light-emitting element that includes the inorganic HTL, and the light-emitting element that includes the inorganic-organic HTL. To be specific, the vertical axis in FIG. 2 indicates the percentage of the luminance of each light-emitting element with its luminance at the point of light emission start standing at 100%. Moreover, the lateral axis in the same indicates time passage measured from the starting point of light emission.

It is noted that the organic HTL contains a mixture of polythiophene conductive polymer (PEDOT/PSS) and polyvinylcarbazole (PVK). The inorganic HTL contains nickel oxide (NiO). Moreover, the inorganic-organic HTL contains a mixture of NiO and PVK. Then, a predetermined voltage was applied to the anode and the cathode to examine time series variations in the luminance of light emitted by each light-emitting element, and the results were obtained as illustrated in FIG. 2.

That is, the organic HTL light-emitting element had a small percentage of luminance decrease immediately after the light emission start, but its luminance thereafter decreased along with time passage. The inorganic-organic HTL light-emitting element had an about 60% decrease immediately after the light emission start with reference to the luminance at the point of light emission start, and the luminance thereafter decreased along with time passage more gently than the organic HTL. The inorganic HTL light-emitting element in contrast had an about 60% decrease immediately after the light emission start with reference to the luminance at the point of light emission start, but the luminance thereafter exhibited almost no change until 100 hours passed, and the luminance decreased around 100 hours later. Further, the experiment has revealed that the organic HTL light-emitting element takes the shortest time before the luminance of light emitted by the light-emitting element reaches a predetermined percentage (for instance, 20%), followed by the inorganic-organic HTL light-emitting element, followed by the inorganic HTL light-emitting element.

These results have revealed that whether the hole transport layer contains an organic material considerably affects decrease in the luminance of light emitted by the light-emitting element. That is, a reaction similar to anode oxidation presumably occurs in the hole transport layer due to electrons overflowed in the light-emitting layer. Moreover, an organic material, which has poorer chemical stability than an inorganic material, seems to be susceptible to this anode oxidation more considerably than the inorganic material. The light-emitting element 3 according to the first embodiment is hence configured such that the hole transport layer 5 is made of an inorganic material in view of its reliability.

Figure 3:
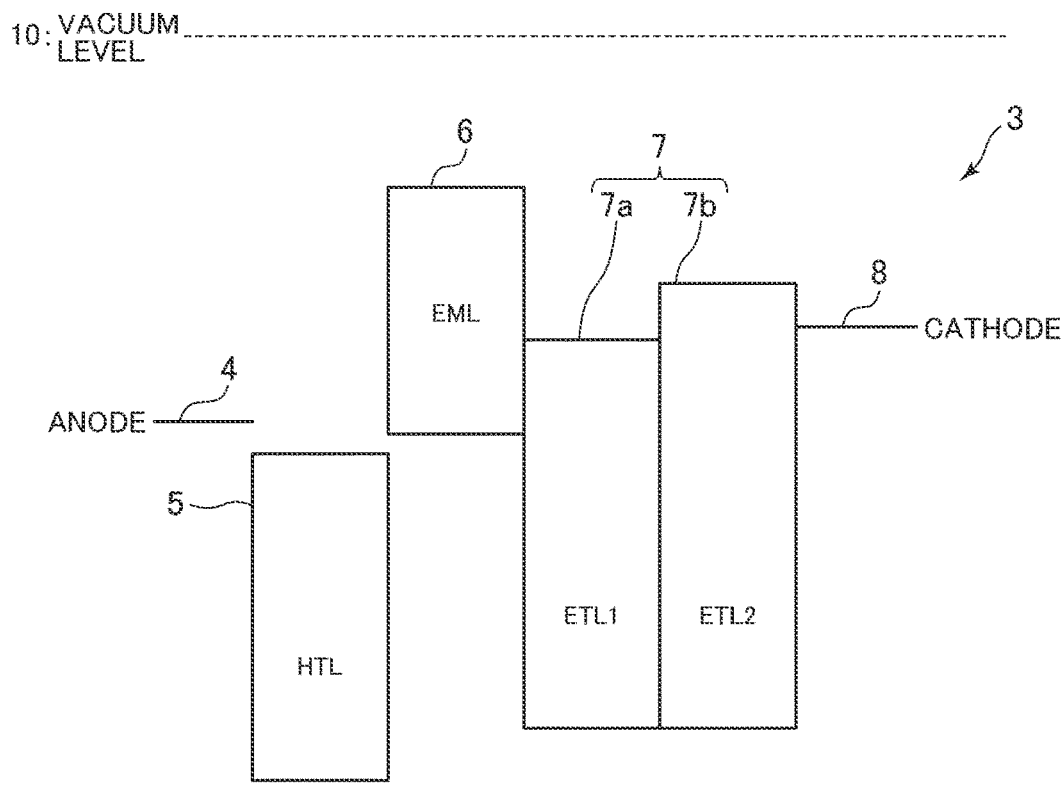
FIG. 3 is an energy diagram illustrating the relationship between the electron affinity and ionization potential in each layer of the light-emitting element according to the first embodiment of the present disclosure.

The following describes the relationship in energy between the hole transport layer 5 and the light-emitting layer 6 with reference to FIG. 3. FIG. 3 is an energy diagram illustrating the relationship between the electron affinity and ionization potential in each layer of the light-emitting element 3 according to the first embodiment of the present disclosure. FIG. 3 illustrates that the hole transport layer 5, the light-emitting layer 6, and the electron transport layer 7 are isolated from each other with no external voltage applied.

It is noted that as illustrated in FIG. 3, the anode 4, the hole transport layer 5, the light-emitting layer 6, the electron transport layer 7 (the first electron transport layer 7a and the second electron transport layer 7b), and the cathode 8 are arranged from the left to the right. In the Description, the hole transport layer 5, the light-emitting layer 6, and the electron transport layer 7 are respectively denoted by HTL, EML, and ETL (ETL 1 and ETL 2) in the drawings.

Further in the energy drawing, the anode 4 and the cathode 8 are indicated by their work functions. The lower end of each of the hole transport layer 5, light-emitting layer 6 and electron transport layer 7 corresponds to the valence band maximum (VBM) and indicates the ionization potential of each layer with reference to a vacuum level 10. It is noted that the VBM corresponds to the highest occupied molecular orbital (HOMO) in a molecule.

Further, the upper end of each of the hole transport layer 5, light-emitting layer 6 and electron transport layer 7 corresponds to the conduction band minimum (CBM) and indicates the electron affinity of each layer with reference to the vacuum level 10. It is noted that the CBM corresponds to the lowest unoccupied molecular orbital (LUMO) in a molecule.

The vacuum level 10 is hereinafter a reference in either case where the ionization potential or the electron affinity is merely described.

As earlier described, the hole transport layer 5 in the light-emitting element 3 according to the first embodiment is made of an inorganic material. The inorganic material constituting the hole transport layer 5 preferably contains at least one semiconductor material among $MoO_3$, $WO_3$, $V_2O_5$, and $ReO_3$ in view of efficient hole injection into the light-emitting layer 6.

That is, the CBM of the hole transport layer 5 containing the foregoing semiconductor material is larger than the work function of the anode 4, as illustrated in FIG. 3. Here, in a joining state where the hole transport layer 5 and the anode 4 are joined together, the energy band shifts in such a manner that the Fermi level of the hole transport layer 5 and the work function of the anode 4 coincide. In the light-emitting element 3 according to the first embodiment, the electron affinity of the hole transport layer 5, which is larger than the work function of the anode 4, increases toward the anode 4 upon voltage application in the joining state, and electrons are removed from the valence band of the light-emitting layer 6, thereby generating holes. The electrons removed from the valence band of the light-emitting layer 6 flow into the anode 4.

This enables the light-emitting element having the hole transport layer 5 containing at least one semiconductor material among $MoO_3$, $WO_3$, $V_2O_5$, and $ReO_3$ to inject holes into the light-emitting layer 6 more efficiently than that having a known structure, and to improve the carrier balance between holes and electrons within the light-emitting layer 6.

Further, the electron affinity of the hole transport layer 5 in the light-emitting element 3 according to the embodiment is larger than the ionization potential of the light-emitting layer 6. That is, the CBM of the hole transport layer 5 is deeper than the VBM of the light-emitting layer 6.

This enables the CBM (electron affinity) of the hole transport layer 5 and the VBM (ionization potential) of the light-emitting layer 6 to be close to each other at a smaller applied voltage than an instance where the CBM of the hole transport layer 5 is shallower than the VBM of the light-emitting layer 6. Moreover, upon voltage application to the light-emitting element 3, the VBM of the light-emitting layer 6 and the CBM of the hole transport layer 5 are joined together through a resonance tunnel, thus enabling electrons to be removed efficiently from the VBM of the light-emitting layer 6 toward the hole transport layer 5.

That is, voltage application brings the VBM of the light-emitting layer 6 and the CBM of the hole transport layer 5 into level coincidence, thereby bringing the wave functions of electrons into coincidence. Then, some of the electrons within the light-emitting layer 6 exude into the hole transport layer 5 and are removed to the anode 4, which has a deeper level than the hole transport layer 5. As described, in the light-emitting element 3, the light-emitting layer 6 with electrons removed therefrom can have holes in its VBM.

Further, the hole transport layer 5 containing these semiconductor materials generate carrier electrons due to deficient oxygen. Here, the density of deficient oxygen in the hole transport layer 5 can be controlled freely by the oxygen concentration of a supplied gas when, for instance, the hole transport layer 5 is formed through sputtering. In film formation through sputtering for instance, setting the oxygen concentration of the supplied gas to a smaller level than usual can increase the density of deficient oxygen in the hole transport layer 5 and can also increase the density of electrons. The Fermi level of the hole transport layer 5 in this case is close to the CBM. Conversely, setting the oxygen concentration of the supplied gas to a larger level than usual in forming the hole transport layer 5 through sputtering can decrease the density of deficient oxygen in the hole transport layer 5 and can also decrease the density of electrons. The Fermi level of the hole transport layer 5 in this case is close to an exact level (the middle of the band gap).

As described, changing the oxygen concentration of the supplied gas in forming the hole transport layer 5 can control the electron density of the hole transport layer 5. In other words, the Fermi level of the hole transport layer 5 can be controlled. Thus, Fermi level control in forming the hole transport layer 5 can control the amount of energy band shift to and from another layer that is in contact with the hole transport layer 5 and can control energy band bending.

As such, the light-emitting element 3 in the light-emitting device 100 according to the first embodiment can control a barrier in electron removal from the light-emitting layer 6 toward the hole transport layer 5, by changing the oxygen concentration of the supplied gas. Moreover, the hole transport layer 5 can have a structure suitable for improving hole injection into the light-emitting layer 6.

Further, the effect of the foregoing resonance tunnel increases along with increase in the difference between the Fermi level of the light-emitting layer 6 and the Fermi level of the hole transport layer 5, or along with decrease in the thickness of the hole transport layer 5. It is thus desirable that the density of deficient oxygen in the hole transport layer 5 stand at $10^{16}$ cm$^{-3}$ or greater and $8 \times 10^{19}$ cm$^{-3}$ or smaller. When the density of deficient oxygen in the hole transport layer 5 stands at smaller than $10^{16}$ cm$^{-3}$, the Fermi level of the hole transport layer 5 is close to an exact level, thus failing to increase the amount of band shift to and from the light-emitting layer 6. When the density of deficient oxygen in the hole transport layer 5 stands at greater than $8 \times 10^{19}$ cm$^{-3}$ conversely, the quality of the hole transport layer 5 degrades, thus increasing a defect or other things that inhibits carrier transport to the light-emitting layer 6.

Further, the hole transport layer 5 preferably has a thickness of 1 to 50 nm inclusive in order for the VBM of the light-emitting layer 6 and the CBM of the hole transport layer 5 to join through the resonance tunnel. The hole transport layer 5 that has a thickness smaller than 1 nm does not become a continuous film in some cases when formed through evaporation or sputtering. Moreover, the hole transport layer 5 that has a thickness greater than 50 nm makes the joining with the light-emitting layer 6 thick, thus attenuating the wave function, thus failing to achieve the resonance tunnel effect in some cases.

It is noted that although not particularly shown in FIG. 3, the light-emitting element 3 may further include a hole injection layer. When the light-emitting element 3 includes a hole injection layer, the hole injection layer is made of a material having a deep CBM, like the hole transport layer 5. The hole injection layer is particularly made of a material having a CBM that falls between the work function of the anode 4 and the CBM of the hole transport layer 5.

It is noted that the hole transport layer 5 and the hole injection layer may undergo UV—$O_3$ processing, annealing, $O_2$ plasma processing and other processing after formation to stabilize the valence of metal elements in the hole transport layer 5 and hole injection layer.

Further, the light-emitting element 3 may be configured such that a P-type semiconductor film of NiO or other materials is formed on a surface of the hole transport layer 5 being in contact with the light-emitting layer 6, in order to prevent excess electron flow from the light-emitting layer 6 into the hole transport layer 5. Alternatively, the light-emitting element 3 may be configured such that an $Al_2O_3$ layer is provided as a passivation layer between the hole transport layer 5 and the light-emitting layer 6.

Material Constituting Electron Transport Layer

The following describes a material constituting the electron transport layer 7.

Figure 4:
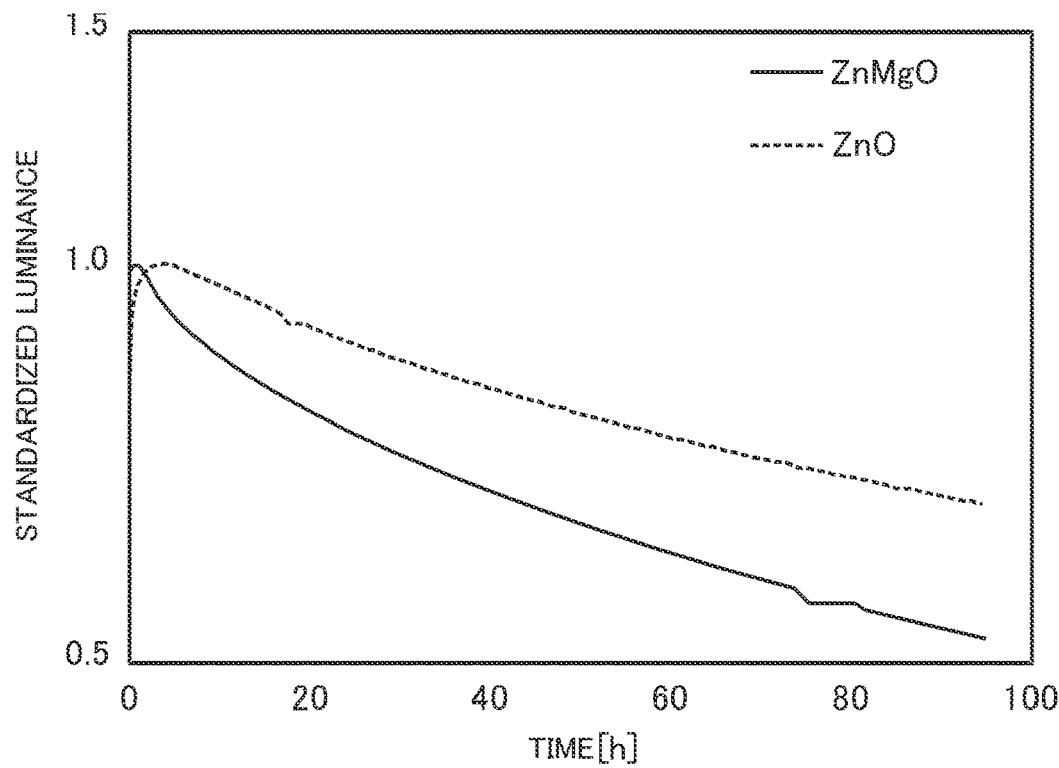
FIG. 4 is a graph showing the relationship between the CBM depth of an electron transport layer and time passage in the luminance of light that is emitted by the light-emitting element, in the light-emitting element according to the first embodiment of the present disclosure.

Firstly, the relationship between the CBM depth of the material constituting the electron transport layer 7, in other words, the size of electron affinity, and electron transportability was studied. That is, a plurality of light-emitting elements were prepared each of which included an ITO anode, an Al cathode, and a NiO hole transport layer, and that included their respective electron transport layers containing materials having different CBMs. Then, the reliability of the plurality of light-emitting elements was examined to obtain a graph shown in FIG. 4. FIG. 4 is a graph showing the relationship between the CBM depth of the electron transport layer and time passage in the luminance of light that is emitted by the light-emitting element, in the light-emitting element 3 according to the first embodiment of the present disclosure. FIG. 4 shows time series variations in the luminance of light emitted by the plurality of light-emitting elements that include their electron transport layers having different CBM depths.

To be specific, a light-emitting element including a ZnMgO-containing electron transport layer was prepared, and a light-emitting element including a ZnO-containing electron transport layer was prepared. Then, time series variations in the luminance of light emitted by these light-emitting elements were examined. It is noted that ZnMgO has a shallower CBM than ZnO. In other words, ZnMgO has a smaller electron affinity than ZnO.

In FIG. 4, the vertical axis indicates the normalized luminance of light emitted by the light-emitting elements (standardized luminance), and the lateral axis indicates time elapsed from the light emission start. FIG. 4 has revealed that luminance reduction is prevented in the light-emitting element including the ZnO electron transport layer further than in the light-emitting element including the ZnMgO electron transport layer. This is because that ZnMgO has a shallower CBM than ZnO, thus further increasing the amount of electron injection into the light-emitting layer. The light-emitting element including the ZnMgO electron transport layer hence has more excessive electrons than the light-emitting element including the ZnO electron transport layer. This accelerates the deterioration of the anode 4 and hole transport layer 5, and as a result, the luminance conceivably decreases considerably along with time passage.

For the foregoing reason, the electron transport layer 7 in the light-emitting device 100 according to the first embodiment preferably contains a material having a deep CBM. The electron transport layer 7 in the light-emitting device 100 according to the first embodiment also has the following configuration in order to prevent electron injection into the light-emitting layer 6 properly.

Configuration of Electron Transport Layer

Figure 5:
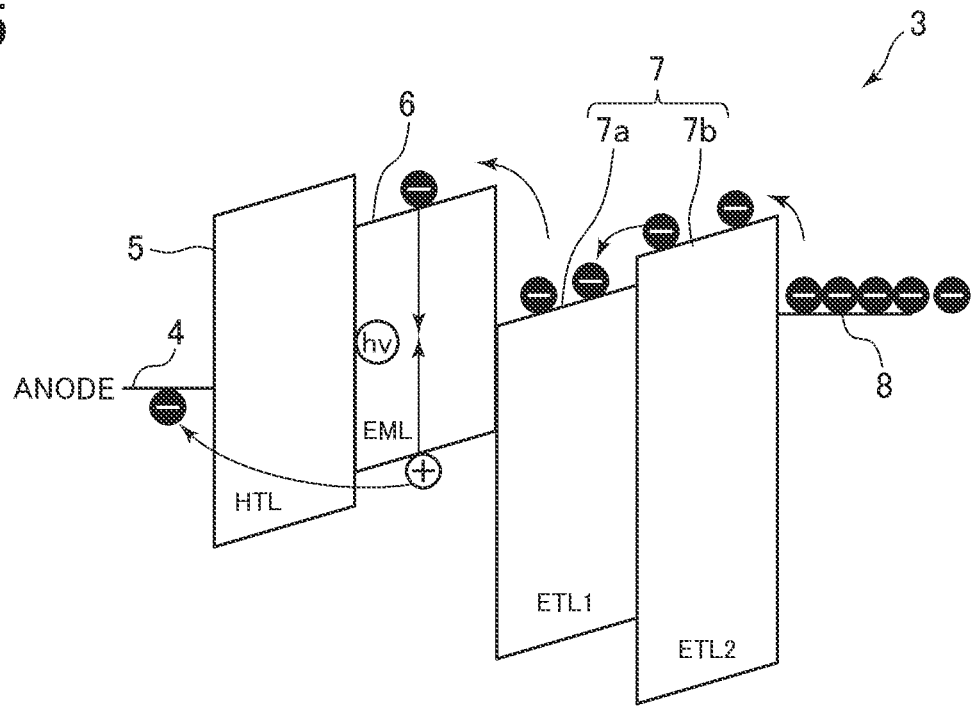
FIG. 5 is an energy diagram illustrating the relationship between the electron affinity and ionization potential in each layer of the light-emitting element according to the first embodiment of the present disclosure.

The following describes the configuration of the electron transport layer 7 included in the light-emitting element 3 with reference to FIG. 5 as well as FIG. 3 described above. FIG. 5 is an energy diagram illustrating the relationship between the electron affinity and ionization potential in each layer of the light-emitting element 3 according to the first embodiment of the present disclosure. FIG. 5 illustrates the relationship between the electron affinity and ionization potential in each layer of the light-emitting element 3 with an external voltage applied across the light-emitting device 100 according to the first embodiment. It is noted that FIG. 5 illustrates electrons, which are denoted by "−", holes, which are denoted by "+", and directions in which electrons and holes move, which are denoted by arrows. The drawing also illustrates a photon, which is denoted by "hv".

To prevent electron injection into the light-emitting layer 6, the light-emitting element 3 according to the first embodiment is configured such that the electron transport layer 7 has a region having a larger electron affinity than a surrounding region, as illustrated in FIG. 3 and FIG. 5; in other words, the electron transport layer 7 has a potential well that is a region having a deeper CBM than a surrounding region. The light-emitting element 3 in the light-emitting device 100 according to the first embodiment has this potential well in the first electron transport layer 7a.

That is, the electron transport layer 7 includes the first electron transport layer 7a and the second electron transport layer 7b. Moreover, the first electron transport layer 7a and the second electron transport layer 7b are disposed adjacently in this order from the light-emitting layer 6 toward the cathode 8. Between the adjacently disposed first electron transport layer 7a and second electron transport layer 7b, the first electron transport layer 7a has a CBM deeper than the CBM of each of the second electron transport layer 7b and light-emitting layer 6 disposed around the first electron transport layer 7a. This enables the light-emitting element 3 to have a potential well in the electron transport layer 7.

When the light-emitting element 3 has such a potential well in the electron transport layer 7, electrons injected from the cathode 8 as illustrated in FIG. 5 fall into the potential well, thus lowering the rate of electron injection into the light-emitting layer 6. That is, electrons have low energy upon falling into the potential well. Moreover, the electrons fallen into the potential well need to be excited again to a high energy state in order to be injected into the CBM of the light-emitting layer 6. The light-emitting element 3 having a potential well in the electron transport layer 7 can hence prevent electron injection into the light-emitting layer 6.

The light-emitting element 3 according to the first embodiment can thus prevent electron injection into the light-emitting layer 6 and can improve the carrier balance. Moreover, the anode 4 and the hole transport layer 5 can be prevented from deterioration that is caused by electrons overflowed from the light-emitting layer 6.

It is noted that the effective-state density of electrons within the first electron transport layer 7a having the potential well is sufficiently larger than the density of electrons that are injected from the cathode 8 (i.e., the density of injected carries) during the driving of the light-emitting device 100. Hence, electrons fallen into the potential well never flood.

The potential well can be formed in the electron transport layer 7 in the following manner in the light-emitting device 100 according to the first embodiment.

That is, two layers of nanoparticles (e.g., ZnO nanoparticles) having different average particle diameters are stacked onto the light-emitting layer 6 to form the first electron transport layer 7a and the second electron transport layer 7b. The first electron transport layer 7a and the second electron transport layer 7b can be formed by, for instance, applying a colloidal solution with ZnO nanoparticles dispersed therein onto the light-emitting layer 6. At this time, the ZnO nanoparticles constituting the first electron transport layer 7a have a larger average particle diameter than the ZnO nanoparticles constituting the second electron transport layer 7b.

The first electron transport layer 7a, which as described, contains ZnO nanoparticles having a larger average particle diameter than the second electron transport layer 7b, has a larger electron affinity through a quantum effect than the second electron transport layer 7b, as illustrated in FIG. 3. The first electron transport layer 7a furthermore has a larger electron affinity than the light-emitting layer 6. That is, the first electron transport layer 7a has a larger electron affinity than both of the adjacent light-emitting layer 6 and second electron transport layer 7b. In other words, the first electron transport layer 7a has a deeper CBM than both of the adjacent light-emitting layer 6 and second electron transport layer 7b.

Forming the first electron transport layer 7a and the second electron transport layer 7b individually by using ZnO nanoparticles having different average particle diameters, as described, offers the light-emitting element 3 that has a potential well in the first electron transport layer 7a. In contrast, the first electron transport layer 7a and the second electron transport layer 7b have the almost same VBM.

It is noted that the average particle diameter of the ZnO nanoparticles constituting the first electron transport layer 7a and the average particle diameter of the ZnO nanoparticles constituting the second electron transport layer 7b are preferably different by 1 nm or greater. A 1 nm or greater difference in particle diameter between both can establish a proper degree of difference between the electron affinity of the first electron transport layer 7a and the electron affinity of the second electron transport layer 7b. That is, the depth of the potential well can be set to a proper depth.

Further, the material constituting the electron transport layer 7 is not limited to the foregoing ZnO nanoparticles. For instance, the material constituting the electron transport layer 7 may be a material, such as ZnMgO, that can be processed into nanoparticles.

Further, each of the first electron transport layer 7a and second electron transport layer 7b can have a thickness of 1 to 100 nm inclusive, particularly preferably a thickness of 5 to 100 nm inclusive.

When the thickness of the first electron transport layer 7a is smaller than 1 nm, electrons transported from the second electron transport layer 7b to the first electron transport layer 7a pass through the potential well formed in the first electron transport layer 7a and are highly likely to be injected into the light-emitting element 6. This renders the prevention of electron injection into the light-emitting layer 6 insufficient.

When the thickness of the first electron transport layer 7a is greater than 100 nm in contrast, the potential well has a wide width. This prevents electron injection into the light-emitting layer 6 more than necessary. Hence, the carrier balance within the light-emitting layer 6 is inclined to an excess of holes, thus lowering its light emission efficiency.

As such, the light-emitting device 100 according to the first embodiment is configured such that the light-emitting element 3 has a potential well in the electron transport layer 7. This can prevent transport of electrons that are injected from the cathode 8 and then travel toward the light-emitting layer 6.

The light-emitting device 100 according to the first embodiment is also configured such that the light-emitting element 3 includes the hole transport layer 5 containing at least any one of $MoO_3$, $WO_3$, $V_2O_5$, and $ReO_3$. The light-emitting device 100 can hence enhance the chemical stability of the hole transport layer 5. The light-emitting device 100 according to the first embodiment can thus enhance its reliability. The light-emitting device 100 also enables holes to be injected into the light-emitting layer 6 efficiently and allows, at this time, electrons removed from the valence band of the light-emitting layer 6 to escape to the anode 4 efficiently. The light-emitting device 100 can thus further improve the carrier balance between holes and electrons within the light-emitting layer 6.

It is noted that a suitable example combination of the materials of the respective layers constituting the light-emitting element 3 is described below. That is, the light-emitting element 3 includes the light-emitting layer 6 containing quantum dots. The light-emitting element 3 is also preferably configured such that the anode 4 contains ITO, such that the hole transport layer 5 contains $MoO_3$, such that the first electron transport layer 7a, where the potential well is formed, contains ZnO, such that the second electron transport layer 7b contains ZnMgO, and such that the cathode 8 contains Al.

First Modification

The following describes the light-emitting device 100 according to a first modification of the first embodiment. The light-emitting device 100 according to the first modification of the first embodiment is similar to the light-emitting device 100 according to the first embodiment with the exception that the configuration of the first electron transport layer 7a and second electron transport layer 7b is different as indicated below.

That is, the light-emitting device 100 according to the first embodiment is configured such that the electron transport layer 7 of the light-emitting element 3 includes two layers: the first electron transport layer 7a and the second electron transport layer 7b. The light-emitting device 100 is also configured such that the average particle diameter of the nanoparticles contained in the first electron transport layer 7a is set so as to be larger than the average particle diameter of the nanoparticles contained in the second electron transport layer 7b, so that a potential well is formed in the first electron transport layer 7a.

In contrast, the light-emitting element 3 of the light-emitting device 100 according to the first modification of the first embodiment includes the first electron transport layer 7a and the second electron transport layer 7b each containing ZnO nanoparticles having similar average particle diameters. Moreover, a ligand coordinating with the ZnO contained in the first electron transport layer 7a has a longer ligand length than a ligand coordinating with the ZnO contained in the second electron transport layer 7b.

That is, for a ligand that coordinates with ZnO, the electron affinity of ZnO increases along with increase in ligand length. In other words, the CBM of ZnO becomes deeper along with increase in ligand length. Accordingly, the light-emitting element 3 according to the first modification of the first embodiment is designed such that the ligand coordinating with the ZnO contained in the first electron transport layer 7a has a longer ligand length than the ligand coordinating with the ZnO contained in the second electron transport layer 7b. This enables the light-emitting element 3 according to the first modification of the first embodiment to have a potential well in the electron transport layer 7.

Second Modification

The following describes the light-emitting device 100 according to a second modification of the first embodiment. The light-emitting device 100 according to the second modification of the first embodiment is similar to the light-emitting device 100 according to the first embodiment with the exception that the configuration of the first electron transport layer 7a and second electron transport layer 7b is different as indicated below.

That is, the light-emitting device 100 according to the first embodiment is configured such that the electron transport layer 7 of the light-emitting element 3 includes two layers: the first electron transport layer 7a and the second electron transport layer 7b. The light-emitting device 100 is also configured such that the average particle diameter of the nanoparticles contained in the first electron transport layer 7a is set so as to be larger than the average particle diameter of the nanoparticles contained in the second electron transport layer 7b, so that a potential well is formed in the first electron transport layer 7a.

In contrast, the light-emitting element 3 of the light-emitting device 100 according to the second modification of the first embodiment includes the first electron transport layer 7a and the second electron transport layer 7b each containing ZnMgO nanoparticles having similar average particle diameters. Another difference lies in that the Mg composition ratio in the ZnMgO contained in the first electron transport layer 7a is smaller than the Mg composition ratio in the ZnMgO contained in the second electron transport layer 7b. That is, x1<x2 is satisfied when the material contained in the first electron transport layer 7a is $Zn_{1-x1}Mg_{x1}O$, and when the material contained in the second electron transport layer 7b is $Zn_{1-x2}Mg_{x2}O$.

Here, ZnMgO is a mixed crystal material of ZnO and MgO and has a larger electron affinity, that is, a deeper CBM along with decrease in its Mg composition ratio. The first electron transport layer 7a thus has a larger electron affinity than the second electron transport layer 7b. This enables the light-emitting element 3 according to the second modification of the first embodiment to have a potential well in the electron transport layer 7.

Third Modification

Figure 6:
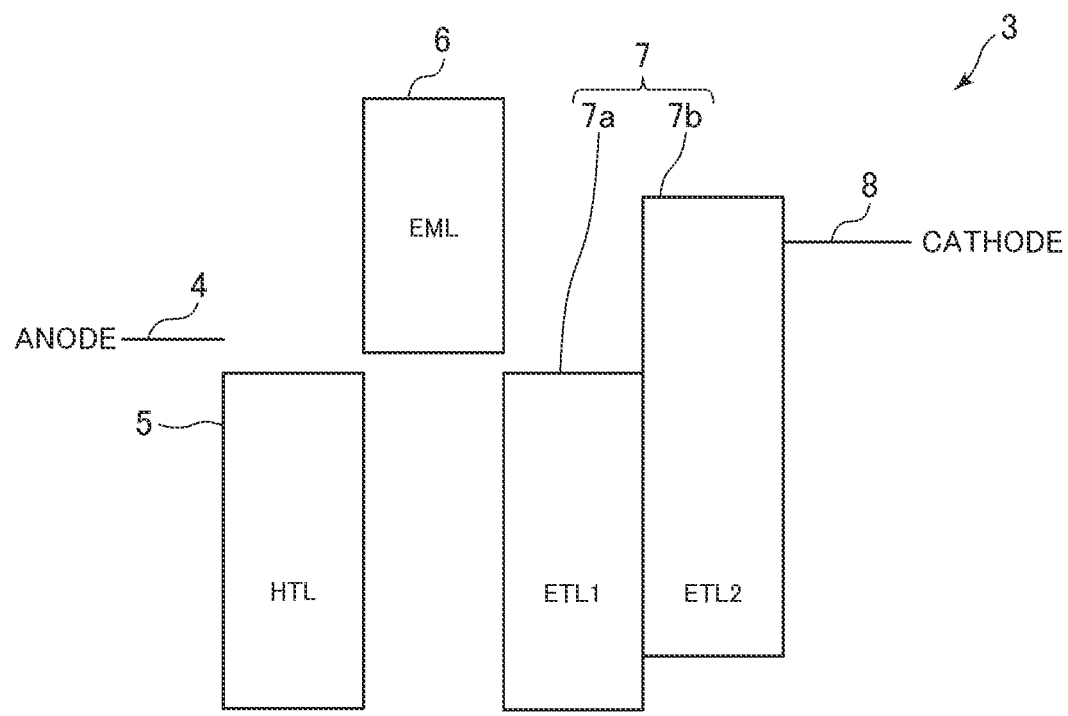
FIG. 6 is an energy diagram illustrating the relationship between the electron affinity and ionization potential in each layer of a light-emitting element according to a third modification of the first embodiment of the present disclosure.

The following describes the light-emitting device 100 according to a third modification of the first embodiment with reference to FIG. 6. FIG. 6 is an energy diagram illustrating the relationship between the electron affinity and ionization potential in each layer of the light-emitting element 3 according to the third modification of the first embodiment of the present disclosure. FIG. 6 illustrates an instance where the hole transport layer 5, the light-emitting layer 6, and the electron transport layer 7 are isolated from each other with no external voltage applied.

The light-emitting device 100 according to the third modification of the first embodiment is similar to the light-emitting device 100 according to the first embodiment with the exception that the configuration of the first electron transport layer 7a and second electron transport layer 7b is different as indicated below.

That is, the light-emitting device 100 according to the first embodiment is configured such that the electron transport layer 7 of the light-emitting element 3 includes two layers: the first electron transport layer 7a and the second electron transport layer 7b. The light-emitting device 100 is also configured such that the average particle diameter of the nanoparticles contained in the first electron transport layer 7a is set so as to be larger than the average particle diameter of the nanoparticles contained in the second electron transport layer 7b, so that a potential well is formed in the first electron transport layer 7a.

In contrast, the light-emitting element 3 of the light-emitting device 100 according to the third modification of the first embodiment has a potential well formed in such a manner that the composition of the material contained in the first electron transport layer 7a is different from the composition of the material contained in the second electron transport layer 7b.

To be specific, in the light-emitting element 3 according to the third modification of the first embodiment, the material contained in the first electron transport layer 7a is a material having a CBM deeper than the material contained in the second electron transport layer 7b, in other words, a material having a larger electron affinity than the second electron transport layer 7b. FIG. 6 illustrates an instance where the material contained in the first electron transport layer 7a is a material having as deep a CBM as the hole transport layer 5, in other words, a material having an electron affinity equal to the electron affinity of the hole transport layer 5. In the light-emitting element 3 according to the third modification of the first embodiment for instance, the material contained in the hole transport layer 5 (at least one of $MoO_3$, $WO_3$, $V_2O_5$ and $ReO_3$) is used as the material contained in the first electron transport layer 7a. In contrast, a material, such as ZnO, having a shallower CBM, that is, a smaller electron affinity than the first electron transport layer 7a is used as the material contained in the second electron transport layer 7b.

The light-emitting element 3 according to the third modification of the first embodiment, which as described, includes the first electron transport layer 7a containing a material having a deeper CBM than the material contained in the second electron transport layer 7b, can have a potential well in the electron transport layer 7.

Figure 7:
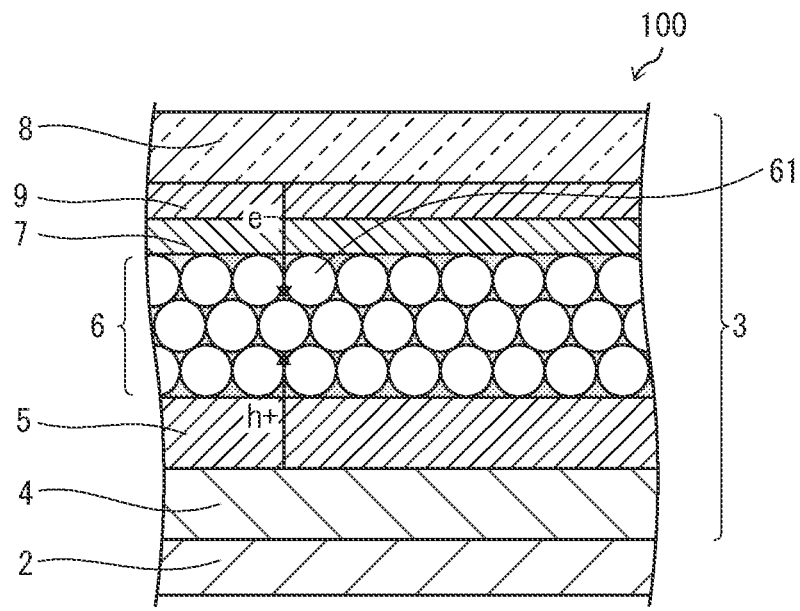
FIG. 7 is a schematic sectional view of the light-emitting device according to the first embodiment of the present disclosure.

It is noted that the light-emitting device 100 according to the first embodiment is configured such that the electron transport layer 7 includes the first electron transport layer 7a and the second electron transport layer 7b. However, the light-emitting device 100 according to the first embodiment may include an electron injection layer 9, as illustrated in FIG. 7, instead of the second electron transport layer 7b. FIG. 7 is a schematic sectional view of the light-emitting device 100 according to the first embodiment of the present disclosure.

The light-emitting device 100, which further includes the electron injection layer 9 as described, can achieve the following effect. That is, providing the electron injection layer 9 can establish a predetermined thickness between the light-emitting layer 6 and the cathode 8 even when the electron transport layer 7 has small electron mobility and cannot be rendered thick. This can prevent a short circuit between the light-emitting layer 6 and the cathode 8.

It is noted that the light-emitting element 3, when including the electron injection layer 9, has a potential well in at least one of the electron transport layer 7 and electron injection layer 9. For instance, the light-emitting element 3 may have a potential well in the electron transport layer 7 located between the light-emitting layer 6 and the electron injection layer 9.

Second Embodiment

Figure 8:
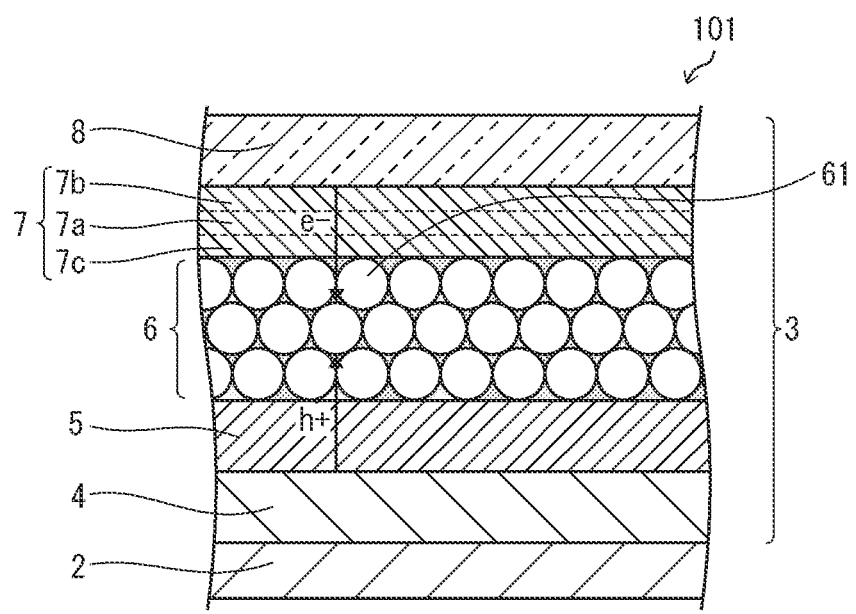
FIG. 8 is a schematic sectional view of a light-emitting device according to a second embodiment of the present disclosure.
Figure 9:
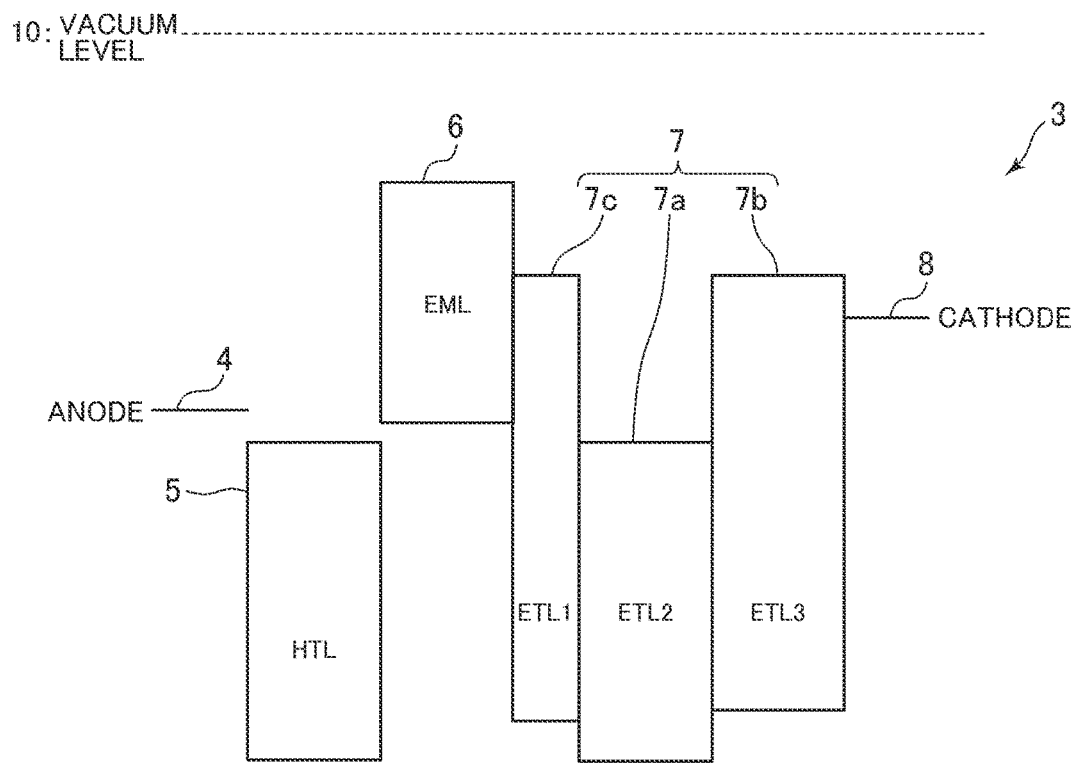
FIG. 9 is an energy diagram illustrating the relationship between the electron affinity and ionization potential in each layer of a light-emitting element included in the light-emitting device according to the second embodiment of the present disclosure.

The following describes a light-emitting device 101 according to a second embodiment with reference to FIGS. 8 and 9. FIG. 8 is a schematic sectional view of the light-emitting device 101 according to the second embodiment of the present disclosure. FIG. 9 is an energy diagram illustrating the relationship between the electron affinity and ionization potential in each layer of the light-emitting element 3 included in the light-emitting device 101 according to the second embodiment of the present disclosure. FIG. 9 illustrates an instance where the hole transport layer 5, the light-emitting layer 6, and the electron transport layer 7 are isolated from each other with no external voltage applied.

The foregoing light-emitting device 100 according to the first embodiment is configured such that the electron transport layer 7 of the light-emitting element 3 includes two layers: the first electron transport layer 7a and the second electron transport layer 7b. In contrast, the light-emitting device 101 according to the second embodiment is different in that the electron transport layer 7 of the light-emitting element 3 includes three layers: the first electron transport layer 7a, the second electron transport layer 7b, and a third electron transport layer 7c. That is, the light-emitting element 3 in the light-emitting device 101 according to the second embodiment includes the anode 4, the hole transport layer 5, the light-emitting layer 6, the electron transport layer 7 (the third electron transport layer 7c, the first electron transport layer 7a and the second electron transport layer 7b), and the cathode 8 arranged from the left to the right, as illustrated in FIG. 9. Moreover, a potential well is formed in the first electron transport layer 7a.

The light-emitting device 101 according to the second embodiment is similar to the light-emitting device 1 according to the first embodiment with the exception, as described, that the electron transport layer 7 consists of three layers, and that the first electron transport layer 7a, where a potential well is formed, is disposed between the second electron transport layer 7b and the third electron transport layer 7c. Accordingly, like components will be denoted by the same signs, and their description will be omitted.

To be specific, the light-emitting device 101 according to the second embodiment further includes, in the foregoing configuration of the light-emitting device 100 according to the first embodiment, the third electron transport layer 7c between the light-emitting layer 6 and the first electron transport layer 7a. Moreover, the electron affinity of the third electron transport layer 7c is larger than the electron affinity of the light-emitting layer 6 and is smaller than the electron affinity of the first electron transport layer 7a. In other words, the CBM of the third electron transport layer 7c is deeper than the CBM of the light-emitting layer 6 and is shallower than the CBM of the first electron transport layer 7a.

Moreover, the size of the ionization potential of the third electron transport layer 7c is equal to the size of the ionization potential of the second electron transport layer 7b. In other words, the VBM of the third electron transport layer 7c is as deep as the VBM of the second electron transport layer 7b. That is, the third electron transport layer 7c is composed of nanoparticles having the same composition as the second electron transport layer 7b.

In contrast, the first electron transport layer 7a contains nanoparticle having the same composition as the second electron transport layer 7b and third electron transport layer 7c, but the average particle diameter of the nanoparticles contained in the first electron transport layer 7a is larger than the average particle diameter of the nanoparticles contained in each of the second electron transport layer 7b and third electron transport layer 7c by 1 nm or greater.

The first electron transport layer 7a thus has a sufficiently larger electron affinity than the second electron transport layer 7b and the third electron transport layer 7c. The light-emitting element 3 in the light-emitting device 101 according to the second embodiment thus has a potential well formed in the first electron transport layer 7a located between the third electron transport layer 7c and the second electron transport layer 7b.

The light-emitting element 3 in the light-emitting device 101 according to the second embodiment can thus improve the carrier balance within the light-emitting layer 6 and can enhance its light emission efficiency. Further, excessive electrons within the light-emitting layer 6 can be reduced, thereby preventing the deterioration of the hole transport layer 5 and anode 4. The light-emitting device 101 according to the second embodiment can thus enhance its reliability.

It is noted that a suitable example combination of the materials of the respective layers constituting the light-emitting element 3 in the light-emitting device 101 according to the second embodiment is described below. That is, the light-emitting element 3 includes the light-emitting layer 6 containing quantum dots. Moreover, the light-emitting element 3 is preferably configured such that the anode 4 contains ITO, such that the hole transport layer 5 contains $MoO_3$, such that the first electron transport layer 7a, where a potential well is formed, contains ZnO, such that the second electron transport layer 7b and the third electron transport layer 7c, which sandwich the first electron transport layer 7a, contain ZnMgO, and such that the cathode 8 contains Al.

The light-emitting device 101 according to the second embodiment is configured, as described above, such that the first electron transport layer 7a, the second electron transport layer 7b, and the third electron transport layer 7c are composed of nanoparticles having the same composition, and such that a potential well is formed in the first electron transport layer 7a by regulating the size of the average particle diameter of these nanoparticles. However, this configuration is non-limiting. For instance, a potential well may be formed in the first electron transport layer 7a in the following configuration.

That is, the first electron transport layer 7a, the second electron transport layer 7b, and the third electron transport layer 7c contain ZnO nanoparticles having the same average particle diameter. Moreover, a ligand coordinating with the ZnO contained in the first electron transport layer 7a may have a longer ligand length than a ligand coordinating with the ZnO contained in each of the second electron transport layer 7b and third electron transport layer 7c.

Further, the first electron transport layer 7a, the second electron transport layer 7b, and the third electron transport layer 7c contain ZnMgO nanoparticles having the same average particle diameter. Moreover, the Mg composition ratio in the ZnMgO contained in the first electron transport layer 7a may be smaller than the Mg composition ratio in the ZnMgO contained in each of the second electron transport layer 7b and third electron transport layer 7c.

Alternatively, the material contained in the first electron transport layer 7a may be a material having a deeper CBM than the material contained in each of the second electron transport layer 7b and third electron transport layer 7c. For instance, the material contained in each of the second electron transport layer 7b and third electron transport layer 7c can be nanoparticles of ZnO, and the material contained in the first electron transport layer 7a can be nanoparticles of at least one of $MoO_3$, $WO_3$, $V_2O_5$, and $ReO_3$, which constitutes the hole transport layer 5.

First Modification

Figure 10:
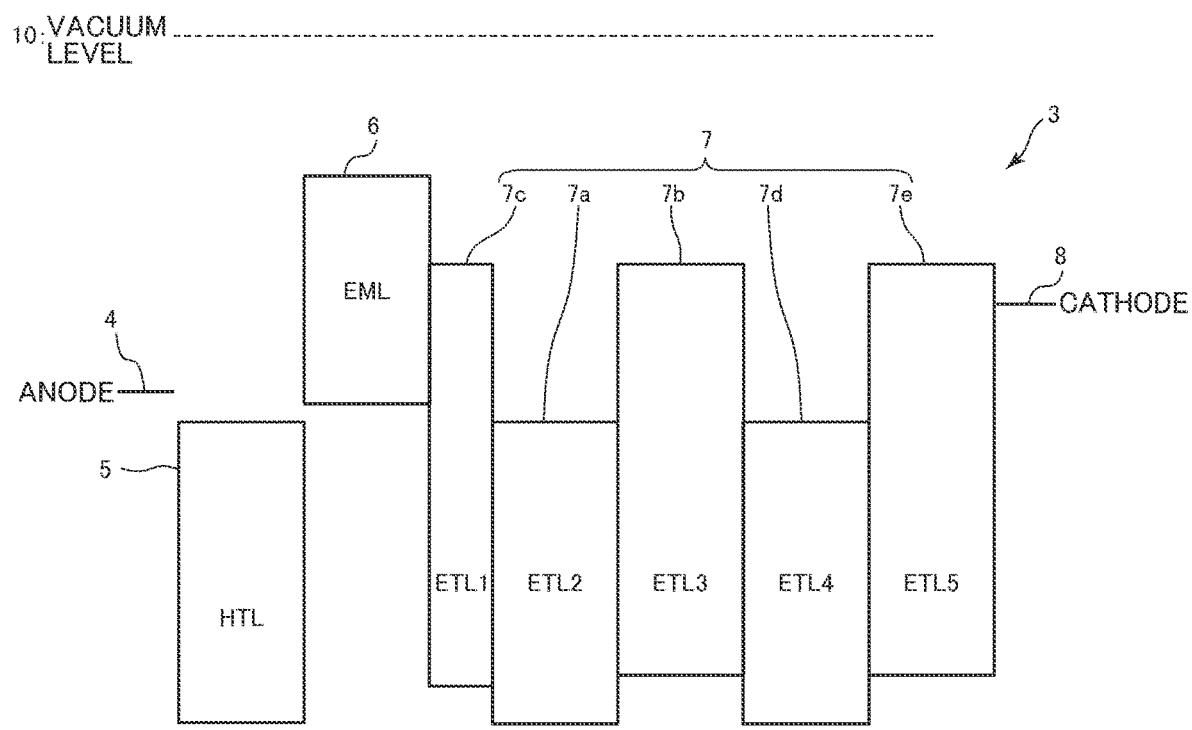
FIG. 10 is an energy diagram illustrating the relationship between the electron affinity and ionization potential in each layer of a light-emitting element according to a first modification of the second embodiment of the present disclosure.

The following describes the light-emitting device 101 according to a first modification of the second embodiment with reference to FIG. 10. FIG. 10 is an energy diagram illustrating the relationship between the electron affinity and ionization potential in each layer of the light-emitting element 3 according to the first modification of the second embodiment of the present disclosure. FIG. 10 illustrates an instance where the hole transport layer 5, the light-emitting layer 6, and the electron transport layer 7 are isolated from each other with no external voltage applied.

The foregoing light-emitting device 101 according to the second embodiment is configured such that the electron transport layer 7 of the light-emitting element 3 includes three layers: the first electron transport layer 7a, the second electron transport layer 7b, and the third electron transport layer 7c. In contrast, the light-emitting device 101 according to the first modification of the second embodiment is different in that the electron transport layer 7 of the light-emitting element 3 includes five layers: the first electron transport layer 7a, the second electron transport layer 7b, the third electron transport layer 7c, a fourth electron transport layer 7d, and a fifth electron transport layer 7e. That is, the light-emitting element 3 in the light-emitting device 101 according to the first modification of the second embodiment includes the anode 4, the hole transport layer 5, the light-emitting layer 6, the electron transport layer 7 (the third electron transport layer 7c, the first electron transport layer 7a, the second electron transport layer 7b, the fourth electron transport layer 7d, and the fifth electron transport layer 7e), and the cathode 8 arranged from the left to the right, as illustrated in FIG. 10.

Further, the light-emitting element 3 in the light-emitting device 101 according to the second embodiment has a single potential well in the electron transport layer 7. The light-emitting device 101 according to the first modification of the second embodiment is different in contrast in that the light-emitting element 3 has two potential wells in the electron transport layer 7.

Moreover, the light-emitting device 101 according to the first modification of the second embodiment includes the first electron transport layer 7a and fourth electron transport layer 7d containing a material having a deeper CBM, in other words, a larger electron affinity than the materials contained in the second electron transport layer 7b, third electron transport layer 7c and fifth electron transport layer 7e.

For instance, the first electron transport layer 7a, the second electron transport layer 7b, the third electron transport layer 7c, the fourth electron transport layer 7d, and the fifth electron transport layer 7e contain their respective materials having similar composition. Moreover, the average particle diameter of the materials contained in the first electron transport layer 7a and fourth electron transport layer 7d is larger than the average particle diameter of the materials contained in the second electron transport layer 7b, third electron transport layer 7c and fifth electron transport layer 7e by 1 nm or greater.

Alternatively, the first electron transport layer 7a, the second electron transport layer 7b, the third electron transport layer 7c, the fourth electron transport layer 7d, and the fifth electron transport layer 7e each contain nanoparticles of ZnO. Moreover, a ligand coordinating with the ZnO contained in each of the first electron transport layer 7a and fourth electron transport layer 7d may have a longer ligand length than a ligand coordinating with the ZnO contained in each of the second electron transport layer 7b, third electron transport layer 7c and fifth electron transport layer 7e.

Alternatively, the first electron transport layer 7a, the second electron transport layer 7b, the third electron transport layer 7c, the fourth electron transport layer 7d, and the fifth electron transport layer 7e each contain nanoparticles of ZnMgO. Moreover, the Mg composition ratio in the ZnMgO contained in the first electron transport layer 7a and fourth electron transport layer 7d may be smaller than the Mg composition ratio in the ZnMgO contained in each of the second electron transport layer 7b, third electron transport layer 7c and fifth electron transport layer 7e.

Alternatively, the first electron transport layer 7a and the fourth electron transport layer 7d are composed of nanoparticles of at least one of $MoO_3$, $WO_3$, $V_2O_5$ and $ReO_3$. In contrast, the second electron transport layer 7b, the third electron transport layer 7c, and the fifth electron transport layer 7e may be composed of nanoparticles of ZnO for instance.

As described, the light-emitting device 101 according to the first modification of the second embodiment, which can have a plurality of potential wells in the electron transport layer 7, can prevent electron transport from the cathode 8 to the light-emitting layer 6 more effectively.

The light-emitting device 101 according to the first modification of the second embodiment can thus improve the carrier balance within the light-emitting layer 6 and can enhance its light emission efficiency. Further, excessive electrons within the light-emitting layer 6 can be reduced, thereby preventing the deterioration of the hole transport layer 5 and anode 4. The light-emitting device 101 according to the first modification of the second embodiment can thus enhance its reliability.

It is noted that the light-emitting device 101 according to the first modification of the second embodiment is configured such that the light-emitting element 3 includes the electron transport layer 7 consisting of five layers and has two potential wells in the electron transport layer 7. However, the number of potential wells is not limited to two; the light-emitting device 101 according to the first modification of the second embodiment may have more than two potential wells. Further, the number of layers that constitute the electron transport layer 7 may be increased in accordance with the number of potential wells to be formed.

Further, the light-emitting device 101 according to the second embodiment may further include, like the foregoing light-emitting device 100 according to the first embodiment, the electron injection layer 9 between the electron transport layer 7 and the cathode 8.

Further, the first embodiment and the second embodiment have described, by way of example, the light-emitting element 3 that includes the light-emitting layer 6 containing the quantum dots 61. However, the light-emitting layer 6 included in the light-emitting element 3 does not have to contain quantum dots. The light-emitting layer 6 in this case can be made of, for instance, an organic fluorescent material or an organic phosphorescent material.

Further, the elements appeared in the foregoing embodiments and modifications can be combined as appropriate unless otherwise contradicted.

The invention claimed is:
1. A light-emitting element comprising:
a cathode;
an anode;
a light-emitting layer provided between the cathode and the anode;
an electron transport layer provided between the cathode and the light-emitting layer; and
a potential well provided between the cathode and the light-emitting layer, and being a region having an electron affinity larger than an electron affinity of a surrounding region,
wherein the electron transport layer includes a first electron transport layer and a second electron transport layer disposed adjacently and sequentially from the light-emitting layer toward the cathode, and the first electron transport layer is disposed where the potential well is formed, an electron affinity of the first electron transport layer is larger than each of an electron affinity of the light-emitting layer and an electron affinity of the second electron transport layer, and the first electron transport layer and the second electron transport layer contain:
  (i) nanoparticles of ZnO, wherein
    a ligand coordinating with the ZnO nanoparticles contained in the first electron transport layer has a ligand length longer than a ligand length of a ligand coordinating with the ZnO nanoparticles contained in the second electron transport layer; or
  (ii) nanoparticles of ZnMgO, wherein
    a Mg composition ratio in the ZnMgO nanoparticles contained in the first electron transport layer is smaller than a Mg composition ratio in the ZnMgO nanoparticles contained in the second electron transport layer.

2. The light-emitting element according to claim 1, further comprising:
an electron injection layer provided between the electron transport layer and the cathode.

3. The light-emitting element according to claim 1, wherein a size of an ionization potential of the first electron transport layer is equal to a size of an ionization potential of the second electron transport layer.

4. The light-emitting element according to claim 3, wherein
the first electron transport layer and the second electron transport layer contain the nanoparticles having an identical composition, and
an average particle diameter of the nanoparticles contained in the first electron transport layer is larger than an average particle diameter of the nanoparticles contained in the second electron transport layer.

5. The light-emitting element according to claim 4, wherein the average particle diameter of the nanoparticles contained in the first electron transport layer and the average particle diameter of the nanoparticles contained in the second electron transport layer are different by 1 nm or greater.

6. The light-emitting element according to claim 1, wherein the first electron transport layer has a thickness of 1 to 100 nm, inclusive.

7. The light-emitting element according to claim 1, further comprising:
a hole transport layer provided between the anode and the light-emitting layer and configured to transport a hole injected from the anode to the light-emitting layer,
wherein an electron affinity of the hole transport layer is larger than a work function of the anode.

8. A light-emitting element comprising:
a cathode;
an anode;
a light-emitting layer provided between the cathode and the anode;
an electron transport layer provided between the cathode and the light-emitting layer; and
a potential well provided between the cathode and the light-emitting layer, and being a region having an electron affinity larger than an electron affinity of a surrounding region,
wherein the electron transport layer includes a first electron transport layer and a second electron transport layer disposed adjacently and sequentially from the light-emitting layer toward the cathode, and the first electron transport layer is disposed where the potential well is formed, an electron affinity of the first electron transport layer is larger than an electron affinity of the second electron transport layer, the electron transport layer further includes a third electron transport layer between the light-emitting layer and the first electron transport layer, and an electron affinity of the third electron transport layer is larger than an electron affinity of the light-emitting layer and is smaller than the electron affinity of the first electron transport layer.

9. The light-emitting element according to claim 8, wherein a size of an ionization potential of the third electron transport layer is equal to a size of an ionization potential of the first electron transport layer and a size of an ionization potential of the second electron transport layer.

10. The light-emitting element according to claim 8, wherein
the third electron transport layer contains nanoparticles having a composition identical to a composition of nanoparticles contained in the first electron transport layer and the second electron transport layer, and
an average particle diameter of the nanoparticles contained in the first electron transport layer is larger than an average particle diameter of the nanoparticles contained in the second electron transport layer and the third electron transport layer.

11. The light-emitting element according to claim 10, wherein the average particle diameter of the nanoparticles contained in the first electron transport layer are different from the average particle diameter of the nanoparticles contained in the second electron transport layer and the third electron transport layer by 1 nm or greater.

12. The light-emitting element according to claim 8, wherein
the first electron transport layer, the second electron transport layer, and the third electron transport layer contain nanoparticles of ZnO, and
a ligand coordinating with the ZnO nanoparticles contained in the first electron transport layer has a ligand length longer than a ligand length of a ligand coordinating with the ZnO nanoparticles contained in the second electron transport layer and the third electron transport layer.

13. The light-emitting element according to claim 8, wherein
the first electron transport layer, the second electron transport layer, and the third electron transport layer contain nanoparticles of ZnMgO, and
a Mg composition ratio in the ZnMgO nanoparticles contained in the first electron transport layer is smaller than a Mg composition ratio in the ZnMgO nanoparticles contained in the second electron transport layer and the third electron transport layer.

14. A light-emitting element comprising:
a cathode;
an anode;
a light-emitting layer provided between the cathode and the anode;
an electron transport layer provided between the cathode and the light-emitting layer; and
a potential well provided between the cathode and the light-emitting layer, and being a region having an electron affinity larger than an electron affinity of a surrounding region, wherein the electron transport layer includes a first electron transport layer and a second electron transport layer disposed adjacently and sequentially from the light-emitting layer toward the cathode, and the first electron transport layer is disposed where the potential well is formed, an electron affinity of the first electron transport layer is larger than each of an electron affinity of the light-emitting layer and an electron affinity of the second electron transport layer, the light-emitting element further comprises a hole transport layer provided between the anode and the light-emitting layer and configured to transport a hole injected from the anode to the light-emitting layer, and an electron affinity of the hole transport layer is larger than a work function of the anode, and the electron affinity of the hole transport layer is larger than an ionization potential of the light-emitting layer or is equal to the electron affinity of the first electron transport layer.

15. The light-emitting element according to claim 14, wherein a material contained in the first electron transport layer is identical to a material contained in the hole transport layer when the electron affinity of the hole transport layer is equal to the electron affinity of the first electron transport layer.

16. The light-emitting element according to claim 14, wherein the hole transport layer contains at least one of molybdenum oxide, vanadium oxide, tungsten oxide, or rhenium oxide.

* * * * *